United States Patent
Ogata et al.

(10) Patent No.: US 12,411,164 B2
(45) Date of Patent: Sep. 9, 2025

(54) SIGNAL/NOISE DETERMINATION APPARATUS, METHOD, AND RECORDING MEDIUM

(71) Applicant: ADVANTEST CORPORATION, Tokyo (JP)

(72) Inventors: Yuji Ogata, Miyagi (JP); Tomonori Yanagida, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 311 days.

(21) Appl. No.: 18/122,885

(22) Filed: Mar. 17, 2023

(65) Prior Publication Data

US 2023/0417812 A1 Dec. 28, 2023

(30) Foreign Application Priority Data

Jun. 28, 2022 (JP) .................... 2022-103526

(51) Int. Cl.
*G01R 29/26* (2006.01)
*G06N 3/0464* (2023.01)
*G06N 3/048* (2023.01)

(52) U.S. Cl.
CPC .......... *G01R 29/26* (2013.01); *G06N 3/0464* (2023.01); *G06N 3/048* (2023.01)

(58) Field of Classification Search
CPC ............... G01R 33/00; G01R 33/0035; G01R 33/0023; G01R 33/0017; G01R 29/26; G06N 3/048; G06N 3/0464
See application file for complete search history.

(56) References Cited

U.S. PATENT DOCUMENTS

2012/0219195 A1 8/2012 Wu et al.
2021/0142901 A1* 5/2021 Usuda .................... G16H 30/40
(Continued)

FOREIGN PATENT DOCUMENTS

JP 2001-120511 5/2001
JP 2009-113717 5/2009
(Continued)

OTHER PUBLICATIONS

Pierpaolo Croce et al., "Deep Convolutional Neural Networks for Feature-Less Automatic Classification of Independent Components in Multi-Channel Electrophysiological Brain Recordings", IEEE Transactions on Biomedical Engineering, Aug. 2019, vol. 66, Issue: 8, pp. 2372-2380.

*Primary Examiner* — Jermele M Hollington
*Assistant Examiner* — Taqi R Nasir
(74) *Attorney, Agent, or Firm* — Greenblum and Bernstein, P.L.C.

(57) ABSTRACT

A signal/noise determination apparatus includes a plurality of sensors, a determination model recording section, and a signal/noise determining section. The plurality of sensors measure a signal and a noise. The determination model recording section records a determination model used to determine whether components of results of measurement by the sensors expected with hypothetical signal information and hypothetical noise information are from a signal source or a noise source. The determination model is generated by machine learning with the measurement results, the hypothetical signal information, and the hypothetical noise information as training data. The signal/noise determining section determines whether components of the measurement results are from the signal source or the noise source based on the measurement results and the determination model. The signal information includes the position of the signal (Continued)

source and the signal, and the noise information includes the position of the noise source and the noise.

12 Claims, 3 Drawing Sheets

(56) References Cited

U.S. PATENT DOCUMENTS

2021/0169417 A1* 6/2021 Burton .................. A61B 5/4857
2021/0295475 A1* 9/2021 He ........................ G06V 10/993
2022/0160265 A1* 5/2022 Sankhala ............... G16H 40/63

FOREIGN PATENT DOCUMENTS

| JP | 2009-257933 | 11/2009 | |
|----|----|----|----|
| JP | 2012-179352 | 9/2012 | |
| JP | 2014228386 A * | 12/2014 | ............. G01R 29/08 |
| JP | 2021-123242 | 8/2021 | |
| WO | WO-2021214842 A1 * | 10/2021 | ............ F01N 11/002 |

* cited by examiner

SIGNAL/NOISE DETERMINATION APPARATUS, METHOD, AND RECORDING MEDIUM

BACKGROUND OF THE INVENTION

Field of the Invention

The present invention relates to signal and noise measuring.

Description of the Related Art

There has conventionally been known separating a measured signal into a signal component from a signal source of interest and a signal component from an environmental magnetic noise source (see Japanese Patent Application Publication Nos. 2021-123242, 2009-257933, 2009-113717, 2001-120511, 2012-179352, and Pierpaolo Croce, et al. (5 others), "Deep Convolutional Neural Networks for Feature-Less Automatic Classification of Independent Components in Multi-Channel Electrophysiological Brain Recordings", IEEE Transactions on Biomedical Engineering, August, 2019, Volume: 66, Issue: 8, Page(s): 2372-2380, for example). Among others, approaches that use neural networks are known (see Japanese Patent Application Publication Nos. 2009-113717, 2001-120511, 2012-179352, and Pierpaolo Croce, et al. (5 others), "Deep Convolutional Neural Networks for Feature-Less Automatic Classification of Independent Components in Multi-Channel Electrophysiological Brain Recordings", IEEE Transactions on Biomedical Engineering, August, 2019, Volume: 66, Issue: 8, Page(s): 2372-2380, for example).

SUMMARY OF THE INVENTION

However, the use of a neural network requires a large amount of training data, which is difficult to acquire.

It is hence an object of the present invention to easily acquire training data for machine learning used when it is determined whether components of a measured signal are from a signal source or a noise source.

According to the present invention, a signal/noise determination apparatus, includes: a plurality of sensors arranged to measure a signal and a noise; a determination model recording section that records a determination model used to determine whether components of results of measurement by the sensors expected with hypothetical signal information and hypothetical noise information are from a signal source or a noise source, the determination model generated by machine learning with the measurement results, the hypothetical signal information, and the hypothetical noise information as training data; and a signal/noise determining section arranged to determine whether components of the measurement results are from the signal source or the noise source based on the measurement results and the determination model, wherein the signal information includes the position of the signal source and the signal, and the noise information includes the position of the noise source and the noise.

According to the thus constructed signal/noise determination apparatus, a plurality of sensors measure a signal and a noise. A determination model recording section records a determination model used to determine whether components of results of measurement by the sensors expected with hypothetical signal information and hypothetical noise information are from a signal source or a noise source, the determination model generated by machine learning with the measurement results, the hypothetical signal information, and the hypothetical noise information as training data. A signal/noise determining section determines whether components of the measurement results are from the signal source or the noise source based on the measurement results and the determination model. The signal information includes the position of the signal source and the signal. The noise information includes the position of the noise source and the noise.

According to the signal/noise determination apparatus of the present invention, the signal source may be assumed to be arranged within a predetermined single region, and the noise source may be assumed to be arranged around the region.

According to the signal/noise determination apparatus of the present invention, the signal source or the noise source may be assumed to be arranged randomly.

According to the signal/noise determination apparatus of the present invention, the components may be obtained through independent component analysis on the measurement results.

According to the signal/noise determination apparatus of the present invention, the components may be obtained through principal component analysis on the measurement results.

According to the signal/noise determination apparatus of the present invention, the components may be obtained through FFT on the measurement results and further through IFFT on the result of the FFT.

According to the signal/noise determination apparatus of the present invention, the machine learning may be based on a convolutional neural network.

According to the signal/noise determination apparatus of the present invention, a sigmoid function may be used as an activation function for an output layer of the convolutional neural network.

According to the signal/noise determination apparatus of the present invention, a Softmax function may be used as an activation function for an output layer of the convolutional neural network.

According to the signal/noise determination apparatus of the present invention, the signal may be represented as a magnetic dipole moment or a current dipole moment.

The present invention is a signal/noise determination method, with using a signal/noise determination apparatus including a plurality of sensors arranged to measure a signal and a noise, for determining whether components of results of measurement by the sensors are from a signal source or a noise source, the method including: recording a determination model used to determine whether components of results of measurement by the sensors expected with hypothetical signal information and hypothetical noise information are from the signal source or the noise source, the determination model generated by machine learning with the measurement results, the hypothetical signal information, and the hypothetical noise information as training data; and determining whether components of the measurement results are from the signal source or the noise source based on the measurement results and the determination model, wherein the signal information includes the position of the signal source and the signal, and the noise information includes the position of the noise source and the noise.

The present invention is a non-transitory computer-readable medium including a program of instructions for execution by a computer to perform a signal/noise determination process, with using a signal/noise determination apparatus including a plurality of sensors arranged to measure a signal and a noise, for determining whether components of results of measurement by the sensors are from a signal source or a noise source, the signal/noise determination process including: recording a determination model used to determine whether components of results of measurement by the sensors expected with hypothetical signal information and hypothetical noise information are from the signal source or the noise source, the determination model generated by machine learning with the measurement results, the hypothetical signal information, and the hypothetical noise information as training data; and determining whether components of the measurement results are from the signal source or the noise source based on the measurement results and the determination model, wherein the signal information includes the position of the signal source and the signal, and the noise information includes the position of the noise source and the noise.

DESCRIPTION OF THE PREFERRED EMBODIMENT

A preferred embodiment of the present invention will hereinafter be described with reference to the accompanying drawings.

Figure 1:
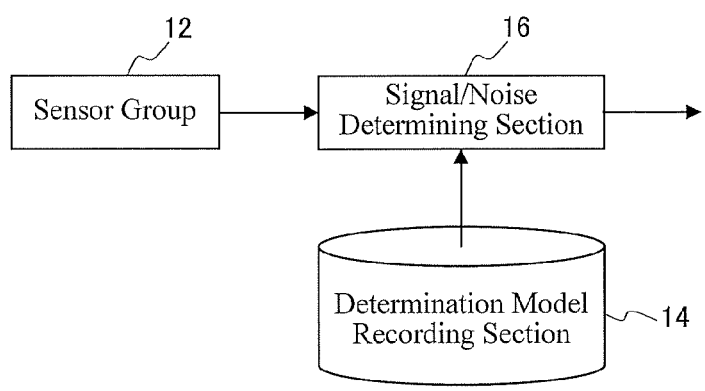
FIG. 1 is a functional block diagram showing the configuration of a signal/noise determination apparatus 1 according to an embodiment of the present invention.
Figure 2:
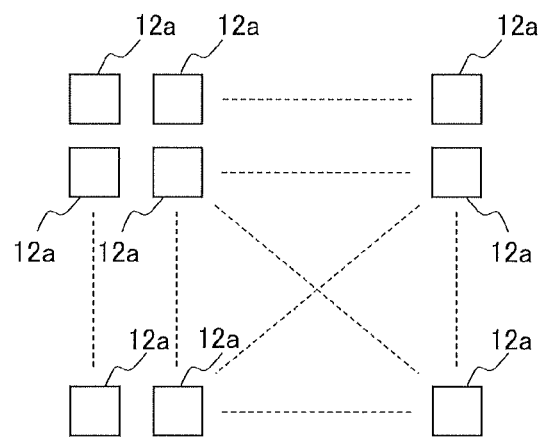
FIG. 2 is a plan view of a sensor group 12.

FIG. 1 is a functional block diagram showing the configuration of a signal/noise determination apparatus 1 according to an embodiment of the present invention. FIG. 2 is a plan view of a sensor group 12. The signal/noise determination apparatus 1 according to the embodiment of the present invention includes a sensor group 12, a determination model recording section 14, and a signal/noise determining section 16.

The sensor group 12 includes multiple sensors 12a. The multiple sensors 12a are arranged to measure a signal and a noise. The signal and the noise are each represented as, for example, a magnetic dipole moment and a current dipole moment. Referring to FIG. 2, the multiple sensors 12a are arranged in a 2-dimensional manner, for example, in an equally spaced manner vertically and horizontally.

Figure 3A:
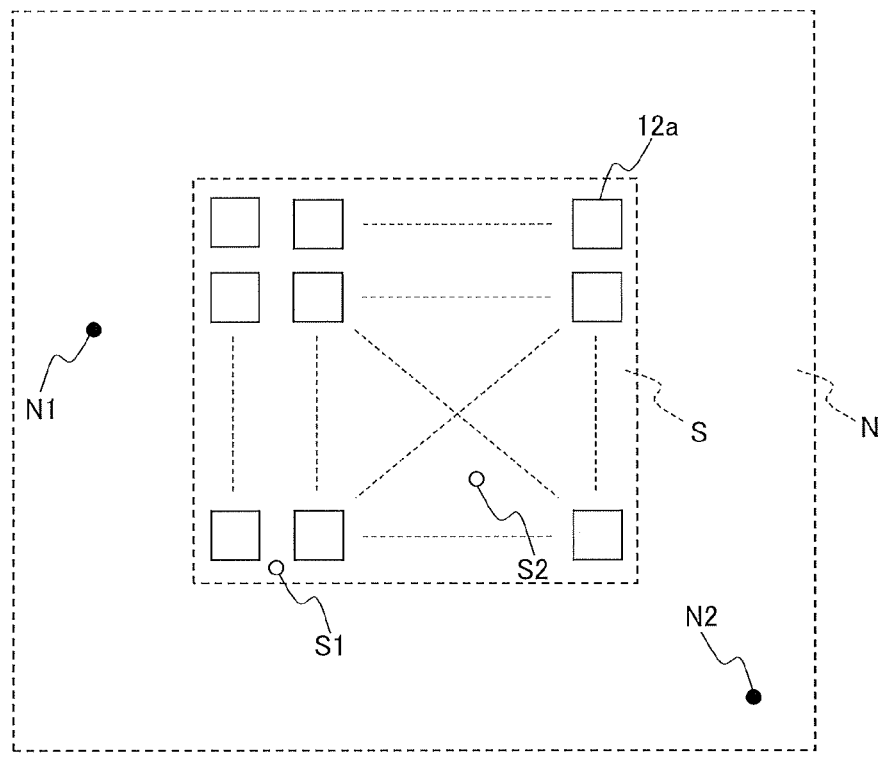
FIGS. 3 (a) and 3 (b) show a positional relationship of the sensor group 12, a signal source region S, and a noise source region N, as a plan view (FIG. 3 (a)) and a front view (FIG. 3 (b)) of the sensor group 12, etc.
Figure 3B:
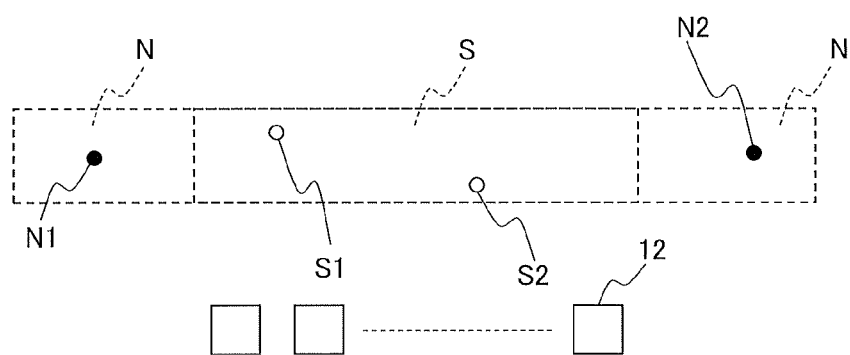

FIG. 3 shows a positional relationship of the sensor group 12, a signal source region S, and a noise source region N, as a plan view (FIG. 3 (a)) and a front view (FIG. 3 (b)) of the sensor group 12, etc.

Signal sources S1, S2 are each arranged to output a signal. Noise sources N1, N2 are each arranged to output a noise. It is noted that while there are two signal sources and two noise sources in the example shown in FIG. 3, there may be three or more signal sources with only one or more noise sources required. It is, however, necessary that the total number of signal sources and noise sources be smaller than the number of the sensors 12a.

The signal source region S is a predetermined single region located almost directly above the sensor group 12. The signal sources S1, S2 exist within the signal source region S. The noise source region N is located around the signal source region S. The noise sources N1, N2 exist within the noise source region N.

The determination model recording section 14 records a determination model used to determine whether components of results of measurement by the sensor group 12 (multiple sensors 12a) are from the signal sources S1, S2 or the noise sources N1, N2. A method of generating the determination model will hereinafter be described.

The signal/noise determining section 16 is arranged to determine whether components of the measurement result are from the signal sources S1, S2 or the noise sources N1, N2 based on the measurement results from the sensor group 12 and the determination model recorded in the determination model recording section 14.

It is noted that the signal/noise determining section 16 is arranged to receive the measurement results from the sensor group 12 and obtain components of the measurement results through independent component analysis or principal component analysis. The signal/noise determining section 16 may also be arranged to obtain components of the measurement results through FFT on the measurement results and further through IFFT on the result of the FFT.

It is noted that the number of components of the measurement results (i.e., the total number of signal sources and noise sources) must have been known in order to perform independent component analysis. It is necessary to estimate the number of components of the measurement results, if has not been known. Here, when eigenvalues (singular values) are calculated from the covariance matrix of the measurement results and arranged in descending order, the number of higher eigenvalues corresponds to the number of components of the measurement results. It is therefore possible for the signal/noise determining section 16 to estimate the number of components of the measurement results by calculating eigenvalues (singular values) from the covariance matrix of the measurement results and obtaining the number of eigenvalues equal to or higher than a predetermined threshold value.

The determination model is arranged to be generated by machine learning (e.g. based on a convolutional neural network) with results of measurement by the sensors 12a expected with hypothetical signal information (i.e. the position of each signal source and the signal) and hypothetical noise information (i.e. the position of each noise source and the noise) (so-called simulation), the hypothetical signal information, and the hypothetical noise information as training data.

It is noted that upon generation of the determination model, the signal source is assumed to be arranged randomly within the signal source region S and the noise source is assumed to be arranged randomly within the noise source region N.

Here, if the signal and the noise are each represented as a magnetic dipole moment (vector m), the magnetic flux density B (function of vector r) generated at each of the sensors 12a is expressed by Biot-Savart's law as in the following formula (1), where $\mu_0$ represents the magnetic constant, and the vector r is the direction vector from the signal source and the noise source (magnetic dipoles) to the sensor 12a.

$$B(\vec{r}) = \frac{\mu_0}{4\pi}\left\{\frac{3(\vec{m}\cdot\vec{r})}{|\vec{r}|^5}\vec{r} - \frac{\vec{m}}{|\vec{r}|^3}\right\} \quad (1)$$

If the sensor 12a is a triaxial sensor, the X component Bx, the Y component By, and the Z component Bz of the magnetic flux density B (function of vector r) can be measured and are expressed as in the following respective formulae (2), (3), and (4), where rx, ry, and rz represent, respectively, the X component, the Y component, and the Z component of the vector r, and mx, my, and mz represent, respectively, the X component, the Y component, and the Z component of the vector m.

$$B_x = \frac{\mu_0}{4\pi}\left\{\left(\frac{3r_x^2}{|\vec{r}|^5} - \frac{1}{|\vec{r}|^3}\right)m_x + \frac{3r_xr_y}{|\vec{r}|^5}m_y + \frac{3r_zr_x}{|\vec{r}|^5}m_z\right\} \quad (2)$$

$$B_y = \frac{\mu_0}{4\pi}\left\{\frac{3r_xr_y}{|\vec{r}|^5}m_x + \left(\frac{3r_y^2}{|\vec{r}|^5} - \frac{1}{|\vec{r}|^3}\right)m_y + \frac{3r_yr_z}{|\vec{r}|^5}m_z\right\} \quad (3)$$

$$B_z = \frac{\mu_0}{4\pi}\left\{\frac{3r_zr_x}{|\vec{r}|^5}m_x + \frac{3r_yr_z}{|\vec{r}|^5}m_y + \left(\frac{3r_z^2}{|\vec{r}|^5} - \frac{1}{|\vec{r}|^3}\right)m_z\right\} \quad (4)$$

With the hypothetical signal information (i.e. the position of the signal source and the signal) and the hypothetical noise information (i.e. the position of the noise source and the noise), the vector r can be obtained based on the positions of the hypothetical signal source and the hypothetical noise source. In addition, the hypothetical signal and the hypothetical noise form the vector m. These vectors r and m can then be substituted into the above formulae (2), (3), and (4) to obtain expected results of measurement by the sensor 12a. It is here necessary to adjust the average of the magnetic flux density B in the time direction to 0.

Alternatively, if the signal and the noise are each represented as a current dipole moment (vector p), the magnetic flux density B (function of vector r) generated at each of the sensors 12a is expressed by Biot-Savart's law as in the following formula (5).

$$B(\vec{r}) = \frac{\mu_0}{4\pi}\frac{(\vec{p}\times\vec{r})}{|\vec{r}|^3} \quad (5)$$

If the sensor 12a is a triaxial sensor, the X component Bx, the Y component By, and the Z component Bz of the magnetic flux density B (function of vector r) can be measured and are expressed as in the following respective formulae (6), (7), and (8), where rx, ry, and rz represent, respectively, the X component, the Y component, and the Z component of the vector r, and px, py, and pz represent, respectively, the X component, the Y component, and the Z component of the vector p.

$$B_x = \frac{\mu_0}{4\pi}\left(\frac{r_z}{|\vec{r}|^3}p_y - \frac{r_y}{|\vec{r}|^3}p_z\right) \quad (6)$$

$$B_y = \frac{\mu_0}{4\pi}\left(\frac{r_x}{|\vec{r}|^3}p_z - \frac{r_z}{|\vec{r}|^3}p_x\right) \quad (7)$$

$$B_z = \frac{\mu_0}{4\pi}\left(\frac{r_y}{|\vec{r}|^3}p_x - \frac{r_x}{|\vec{r}|^3}p_y\right) \quad (8)$$

With the hypothetical signal information (i.e. the position of the signal source and the signal) and the hypothetical noise information (i.e. the position of the noise source and the noise), the vector r can be obtained based on the positions of the hypothetical signal source and the hypothetical noise source. In addition, the hypothetical signal and the hypothetical noise form the vector p. These vectors r and p can then be substituted into the above formulae (6), (7), and (8) to obtain expected results of measurement by the sensor 12a. It is here necessary to adjust the average of the magnetic flux density B in the time direction to 0.

The magnetic field generated by a coil of radius a, number of turns n, and current I can be expressed in a cylindrical coordinate system as in the following formulae (9), (10), and (11).

$$B_z = \frac{\mu_0 nI}{2\pi}\frac{1}{\sqrt{(a+r)^2+z^2}}\left\{K(k) + \frac{a^2-r^2-z^2}{(a-r)^2+z^2}E(k)\right\} \quad (9)$$

$$B_r = \frac{\mu_0 nI}{2\pi}\frac{z}{\sqrt{(a+r)^2+z^2}}\left\{-K(k) + \frac{a^2+r^2+z^2}{(a-r)^2+z^2}E(k)\right\} \quad (10)$$

$$B_\theta = 0 \quad (11)$$

Here, K(k) represents the complete elliptic integral of the first kind and E(k) represents the complete elliptic integral of the second kind, as expressed in the following formulae (12), (13), and (14).

$$K(k) = \int_0^{\frac{\pi}{2}}\frac{d\theta}{\sqrt{1-k^2\sin^2\theta}} \quad (12)$$

$$E(k) = \int_0^{\frac{\pi}{2}}\sqrt{1-k^2\sin^2\theta}\,d\theta \quad (13)$$

$$k^2 = \frac{4ar}{(a+r)^2+z^2} \quad (14)$$

With the hypothetical signal information (i.e. the position of the signal source and the signal) and the hypothetical noise information (i.e. the position of the noise source and the noise), the vector r can be obtained based on the positions of the hypothetical signal source and the hypothetical noise source. In addition, the hypothetical signal and the hypothetical noise form the magnetic field generated by a coil of radius a, number of turns n, and current I. The vector r and the radius a, number of turns n, and current I can then be substituted into the above formulae (9), (10), and (11) to obtain expected results of measurement by the sensor 12a. It is here necessary to adjust the average of the magnetic flux density B in the time direction to 0.

It is noted that in the above-described sensor group 12, the sensors 12a capable of measuring triaxial components are arranged in a 2-dimensional manner. It is, however, conceivable that the sensors 12a may be arranged in a line-shape in a 1-dimensional manner. It is, alternatively, conceivable that the sensors 12a may be arranged sterically in a 3-dimensional manner (as a sensor array). Furthermore, the sensors 12a may be capable of measuring only a monoaxial component or biaxial components.

When the machine learning method is based on a convolutional neural network, the determination model has an input layer, a convolutional layer, a pooling layer, a fully connected layer, and an output layer. When the measurement results from the sensor 12a are provided to the input layer, the output from the input layer is provided to the convolutional layer, the output from the convolutional layer is provided to the pooling layer, the output from the pooling layer is provided to the fully connected layer, and the output from the fully connected layer is provided to the output layer. Whether components of the measurement results are from a signal source (output 1) or a noise source (output 0) is output from the output layer.

It is noted that while one convolutional layer and one pooling layer may be provided as described above, two or more convolutional layers and two or more pooling layers may be provided depending on the number of sensors 12a.

Also, a sigmoid function is used as an activation function for the output layer. However, a Softmax function may be used as an activation function for the output layer. In this case, since the output is multivalued, the distance of the signal source and the noise source from the sensor 12a can be identified roughly. This improves the accuracy when estimating the positions of the signal sources S1, S2 using the measurement results from the sensor 12a.

Next will be described an operation according to the embodiment of the present invention.

A determination model is first prepared and recorded in the determination model recording section 14. The determination model is prepared based on a convolutional neural network. Used as training data are results of measurement by the sensors 12a expected with hypothetical signal information (i.e. the position of each signal source and the signal) and hypothetical noise information (i.e. the position of each noise source and the noise) (so-called simulation), the hypothetical signal information, and the hypothetical noise information.

The actual signal sources S1, S2 and the actual noise sources N1, N2 (see FIG. 3) are then measured with the sensor group 12.

The measurement results from the sensors 12a of the sensor group 12 are provided to the signal/noise determining section 16. Components of the measurement results are obtained through, for example, independent component analysis. It is further determined whether components of the measurement result are from the signal sources S1, S2 or the noise sources N1, N2 based on the measurement results from the sensor group 12 and the determination model recorded in the determination model recording section 14.

In accordance with the embodiment of the present invention, when it is determined through machine learning whether components of a measured signal are from the signal sources S1, S2 or the noise sources N1, N2, used as training data are results of measurement by the sensors 12a expected with hypothetical signal information (i.e. the position of each signal source and the signal) and hypothetical noise information (i.e. the position of each noise source and the noise) (so-called simulation), the hypothetical signal information, and the hypothetical noise information. Thus, in accordance with the embodiment of the present invention, the training data can be acquired more easily compared to the case where an actual measurement result is used as training data.

Incidentally, the above-described embodiment may be achieved as follows. A computer including a CPU, a hard disk, and a medium (USB memory, CD-ROM, or the like) reading device is caused to read a medium with a program recorded thereon that achieves the above-described components (e.g. the determination model recording section 14 and the signal/noise determining section 16) and install the program in the hard disk. The above-described features can also be achieved in this manner.

DESCRIPTION OF REFERENCE NUMERAL

1 Signal/Noise Determination Apparatus
12 Sensor Group
12a Sensors
14 Determination Model Recording Section
16 Signal/Noise Determining Section
S1, S2 Signal Sources
N1, N2 Noise Sources
S Signal Source Region
N Noise Source Region

What is claimed is:

1. A signal/noise determination apparatus, comprising:
a plurality of sensors arranged to measure a signal and a noise;
a memory that stores a determination model used to determine whether components of expected measurement results of the sensors using hypothetical signal information and hypothetical noise information are from a signal source or a noise source, the determination model generated by machine learning with the expected measurement results, the hypothetical signal information, and the hypothetical noise information as training data; and
a processor that determines whether components of actual measurement results are from the signal source or the noise source based on the actual measurement results and the determination model, wherein
the hypothetical signal information includes a first position of the signal source and the signal, and
the hypothetical noise information includes a second position of the noise source and the noise.

2. The signal/noise determination apparatus according to claim 1, wherein
the signal source is assumed to be arranged within a predetermined single region, and
the noise source is assumed to be arranged around the region.

3. The signal/noise determination apparatus according to claim 2, wherein
the signal source or the noise source is assumed to be arranged randomly.

4. The signal/noise determination apparatus according to claim 1, wherein
the components are obtained through independent component analysis on the actual measurement results.

5. The signal/noise determination apparatus according to claim 1, wherein
the components are obtained through principal component analysis on the actual measurement results.

6. The signal/noise determination apparatus according to claim 1, wherein
the components are obtained through Fast Fourier Transform (FFT) on the actual measurement results and further through Inverse Fast Fourier Transform (IFFT) on a result of the FFT.

7. The signal/noise determination apparatus according to claim 1, wherein
the machine learning is based on a convolutional neural network.

8. The signal/noise determination apparatus according to claim 7, wherein
a sigmoid function is used to activate an output layer of the convolutional neural network.

9. The signal/noise determination apparatus according to claim 7, wherein
a Softmax function is used to activate an output layer of the convolutional neural network.

10. The signal/noise determination apparatus according to claim 1, wherein
the signal is represented as a magnetic dipole moment or a current dipole moment.

11. A signal/noise determination method, with using a signal/noise determination apparatus including a plurality of sensors arranged to measure a signal and a noise, for determining whether components of actual measurement results by the sensors are from a signal source or a noise source, the signal/noise determination method comprising:
  storing, in a memory, a determination model used to determine whether components of expected measurement results of the sensors using hypothetical signal information and hypothetical noise information are from the signal source or the noise source, the determination model generated by machine learning with the expected measurement results, the hypothetical signal information, and the hypothetical noise information as training data; and
  determining, by a processor, whether the components of the actual measurement results are from the signal source or the noise source based on the actual measurement results and the determination model, wherein
  the hypothetical signal information includes a first position of the signal source and the signal, and
  the hypothetical noise information includes a second position of the noise source and the noise.

12. A non-transitory computer-readable medium including a program of instructions for execution by a computer to perform a signal/noise determination process, with using a signal/noise determination apparatus including a plurality of sensors arranged to measure a signal and a noise, for determining whether components of actual measurement results by the sensors are from a signal source or a noise source, the signal/noise determination process comprising:
  storing, in a memory, a determination model used to determine whether components of expected measurement results of the sensors using hypothetical signal information and hypothetical noise information are from the signal source or the noise source, the determination model generated by machine learning with the expected measurement results, the hypothetical signal information, and the hypothetical noise information as training data; and
  determining, by a processor, whether the components of the actual measurement results are from the signal source or the noise source based on the actual measurement results and the determination model, wherein
  the hypothetical signal information includes a first position of the signal source and the signal, and
  the hypothetical noise information includes a second position of the noise source and the noise.

* * * * *